(12) United States Patent
McReynolds et al.

(10) Patent No.: US 12,306,243 B2
(45) Date of Patent: May 20, 2025

(54) SPACE TRANSFORMERS CONFIGURED TO BE UTILIZED IN A PROBE SYSTEM, PROBE SYSTEMS THAT INCLUDE THE SPACE TRANSFORMERS, AND RELATED METHODS

(71) Applicant: FormFactor, Inc., Livermore, CA (US)

(72) Inventors: Ernest Gammon McReynolds, Beaverton, OR (US); Timothy E. Lesher, Beaverton, OR (US); Pratik Bakul Ghate, Beaverton, OR (US); Shean Thomas McMahon, Seal Beach, CA (US); Jerry Martynuik, Beaverton, OR (US); David Raschko, Tigard, OR (US); Daniel Bock, Portland, OR (US); Andrew Nelson, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 18/737,250

(22) Filed: Jun. 7, 2024

(65) Prior Publication Data

US 2024/0410936 A1 Dec. 12, 2024

Related U.S. Application Data (60) Provisional application No. 63/472,444, filed on Jun. 12, 2023.

(51) Int. Cl.
*G01R 1/02* (2006.01)
*G01R 1/04* (2006.01)
(Continued)

(52) U.S. Cl.
CPC ..... *G01R 31/2889* (2013.01); *G01R 1/06772* (2013.01); *G01R 1/07342* (2013.01)

(58) Field of Classification Search
CPC . G01R 1/02; G01R 1/04; G01R 1/067; G01R 1/073; G01R 31/00; G01R 31/02; G01R 31/28; G01R 31/302; G01R 29/08
See application file for complete search history.

(56) References Cited

U.S. PATENT DOCUMENTS

| | | |
|---|---|---|
| 3,781,681 A | 12/1973 | Wagner et al. |
| 4,001,685 A | 1/1977 | Roch |

(Continued)

FOREIGN PATENT DOCUMENTS

| | | |
|---|---|---|
| DE | 3908846 A1 | 11/1989 |
| EP | 0298219 A2 | 1/1989 |

(Continued)

*Primary Examiner* — Neel D Shah
(74) *Attorney, Agent, or Firm* — KOLITCH ROMANO DASCENZO GATES LLC (57) ABSTRACT

Space transformers configured to be utilized in a probe system to facilitate electrical communication with a device under test (DUT), probe systems that include the space transformers, and related methods are disclosed herein. The space transformers include a dielectric body, a plurality of first electrical contacts supported by the dielectric body, and a plurality of second electrical contacts supported by the dielectric body. The space transformers also include an electrically conductive radio frequency (RF) signal-modifying trace. The space transformers further include an RF electrical signal-modifying structure in electrical communication with the electrically conductive RF signal-modifying trace. The RF electrical signal-modifying structure is configured to receive the RF electrical signal from an input region of the electrically conductive RF signal-modifying trace and to discharge a modified RF electrical signal to an output region of the electrically conductive RF signal-modifying trace. The RF electrical signal-modifying structure includes a coupler.

22 Claims, 6 Drawing Sheets

(51) Int. Cl.
   *G01R 1/067*   (2006.01)
   *G01R 1/073*   (2006.01)
   *G01R 29/08*   (2006.01)
   *G01R 31/00*   (2006.01)
   *G01R 31/28*   (2006.01)

(56) References Cited

U.S. PATENT DOCUMENTS

| | | |
|---|---|---|
| 5,101,453 A | 3/1992 | Rumbaugh |
| 5,507,652 A | 4/1996 | Wardwell |
| 5,529,504 A | 6/1996 | Greenstein et al. |
| 5,631,572 A | 5/1997 | Sheen et al. |
| 5,914,613 A | 6/1999 | Gleason et al. |
| 5,983,363 A | 11/1999 | Tuttle et al. |
| 6,036,502 A | 3/2000 | Neidich et al. |
| 6,058,497 A | 5/2000 | Tuttle |
| 6,071,009 A | 6/2000 | Clyne |
| 6,156,484 A | 12/2000 | Bassous et al. |
| 6,256,882 B1 | 7/2001 | Gleason et al. |
| 6,305,230 B1 | 10/2001 | Kasukabe et al. |
| 6,441,315 B1 | 8/2002 | Eldridge et al. |
| 6,617,863 B1 | 9/2003 | Kasukabe et al. |
| 6,842,023 B2 | 1/2005 | Yoshida et al. |
| 6,842,606 B1 | 1/2005 | Takemura |
| 7,178,711 B2 | 2/2007 | Wong et al. |
| 7,182,672 B2 | 2/2007 | Tunaboylu et al. |
| 7,190,181 B2 | 3/2007 | Peters et al. |
| 7,218,131 B2 | 5/2007 | Tanioka et al. |
| 7,368,925 B2 | 5/2008 | Navratil et al. |
| 7,368,927 B2 | 5/2008 | Smith et al. |
| 7,388,388 B2 | 6/2008 | Dong |
| 7,550,983 B2 | 6/2009 | Gleason et al. |
| 7,557,596 B2 | 7/2009 | Eldridge et al. |
| 7,688,089 B2 | 3/2010 | Audette et al. |
| 7,768,790 B2 | 8/2010 | Kuroda et al. |
| 7,862,391 B2 | 1/2011 | Johnston et al. |
| 7,888,957 B2 | 2/2011 | Smith et al. |
| 7,893,704 B2 | 2/2011 | Gleason et al. |
| 8,090,414 B2 | 1/2012 | Mickle et al. |
| 8,319,474 B2 | 11/2012 | Mitake et al. |
| 8,351,982 B2 | 1/2013 | Rofougaran |
| 8,364,195 B2 | 1/2013 | Spina et al. |
| 9,188,635 B2 | 11/2015 | Pagani et al. |
| 9,244,099 B2 | 1/2016 | Duckworth et al. |
| 10,571,487 B2 | 2/2020 | Bock et al. |
| 2001/0009061 A1 | 7/2001 | Gleason et al. |
| 2003/0041443 A1 | 3/2003 | Stevenson et al. |
| 2003/0082835 A1 | 5/2003 | McChesney et al. |
| 2003/0107388 A1 | 6/2003 | Reed et al. |
| 2003/0146879 A1 | 8/2003 | Anderson |
| 2004/0223309 A1 | 11/2004 | Haemer et al. |
| 2005/0068019 A1 | 3/2005 | Nakamura et al. |
| 2005/0099763 A1 | 5/2005 | Rathburn |
| 2005/0189958 A1 | 9/2005 | Chen et al. |
| 2005/0218429 A1 | 10/2005 | Mazza et al. |
| 2005/0245291 A1 | 11/2005 | Brown et al. |
| 2006/0241891 A1 | 10/2006 | Kaushal et al. |
| 2007/0064406 A1 | 3/2007 | Beart |
| 2007/0178727 A1 | 8/2007 | Igarashi |
| 2007/0268030 A1 | 11/2007 | Knauer et al. |
| 2008/0054918 A1 | 3/2008 | Lin et al. |
| 2008/0061808 A1 | 3/2008 | Mok et al. |
| 2008/0293277 A1 | 11/2008 | Kumar et al. |
| 2009/0033467 A1 | 2/2009 | Finocchiaro et al. |
| 2009/0157145 A1 | 6/2009 | Cauller |
| 2009/0212795 A1 | 8/2009 | Williams |
| 2009/0214935 A1 | 8/2009 | Berman |
| 2009/0289869 A1 | 11/2009 | Babahkani et al. |
| 2010/0021176 A1 | 1/2010 | Holcombe et al. |
| 2010/0085069 A1 | 4/2010 | Smith et al. |
| 2010/0127725 A1 | 5/2010 | Smith |
| 2010/0148723 A1 | 6/2010 | Cook et al. |
| 2010/0181841 A1 | 7/2010 | Azancot et al. |
| 2010/0214177 A1 | 8/2010 | Parsche |
| 2010/0237889 A1 | 9/2010 | Desta et al. |
| 2010/0244871 A1 | 9/2010 | Blair et al. |
| 2010/0253374 A1 | 10/2010 | Chen et al. |
| 2010/0271062 A1 | 10/2010 | Breinlinger et al. |
| 2011/0043050 A1 | 2/2011 | Yabe et al. |
| 2011/0074341 A1 | 3/2011 | Jensen et al. |
| 2011/0084887 A1 | 4/2011 | Mow et al. |
| 2011/0127845 A1 | 6/2011 | Walley et al. |
| 2011/0130093 A1 | 6/2011 | Walley et al. |
| 2011/0186368 A1 | 8/2011 | Ueno et al. |
| 2011/0266344 A1 | 11/2011 | Tan et al. |
| 2012/0086612 A1 | 4/2012 | Linehan et al. |
| 2012/0091211 A1 | 4/2012 | Kuroda |
| 2012/0153740 A1 | 6/2012 | Soar |
| 2012/0239339 A1 | 9/2012 | Kaneko et al. |
| 2012/0286817 A1 | 11/2012 | Duckworth et al. |
| 2013/0026981 A1 | 1/2013 | Van Der Lee |
| 2016/0341790 A1* | 11/2016 | Thompson ........... H01Q 1/2283 |
| 2018/0149674 A1 | 5/2018 | Bock et al. |

FOREIGN PATENT DOCUMENTS

| | | |
|---|---|---|
| JP | 2004-171905 A | 6/2004 |
| WO | WO2012061568 A2 | 5/2012 |

* cited by examiner

SPACE TRANSFORMERS CONFIGURED TO BE UTILIZED IN A PROBE SYSTEM, PROBE SYSTEMS THAT INCLUDE THE SPACE TRANSFORMERS, AND RELATED METHODS

RELATED APPLICATION

This application claims priority to U.S. Provisional Patent Application No. 63/472,444, which was filed on Jun. 12, 2023, and the complete disclosure of which is hereby incorporated by reference.

FIELD OF THE DISCLOSURE

The present disclosure relates generally to space transformers configured to be utilized in a probe system, to probe systems that include the space transformers, and to related methods.

BACKGROUND OF THE DISCLOSURE

Space transformers often are utilized in the electronics industry to adapt, or transform, a plurality of electrically conductive traces from a first relative spacing, or a first pitch spacing, to a second relative spacing, or a second pitch spacing. The first relative spacing may be associated with a first piece of hardware and/or with a first manufacturing technology, and the second relative spacing may be associated with a second piece of hardware and/or with a second manufacturing technology. As an example, a space transformer may be utilized to adapt electrical traces that may be present on a printed circuit board (i.e., the first piece of hardware and/or the first manufacturing technology) to electrical traces that may be present on an integrated circuit device (i.e., the second piece of hardware and/or the second manufacturing technology).

In the context of a probe system, space transformers may be utilized to at least partially transition electric signals from relatively macro-scale structures, such as may be present at connections to a signal generation and analysis assembly that is utilized to generate the electric signals, to relatively micro-scale structures, such as contact pads of a device under test (DUT). In some situations, it may be desirable to provide high-frequency electric signals, such as radio frequency (RF) and/or millimeter wave (mmWave) electric signals, to the DUT and/or to receive the high-frequency electric signals from the DUT. However, such high-frequency electric signals may degrade as transmission distance is increased and/or based upon an electromagnetic environment of a given high-frequency electric signal during transmission thereof. This may make it difficult, or even impossible, to convey certain high-frequency signals from the signal generation and analysis assembly to the DUT utilizing conventional probe systems that include conventional space transformers. Thus, there exists a need for improved space transformers that are configured to be utilized in a probe system and for related methods.

SUMMARY OF THE DISCLOSURE

Space transformers configured to be utilized in a probe system to facilitate electrical communication with a device under test (DUT), probe systems that include the space transformers, and related methods are disclosed herein. The space transformers include a dielectric body, a plurality of first electrical contacts supported by the dielectric body and arranged with at least one first pitch spacing, and a plurality of second electrical contacts supported by the dielectric body and arranged with at least one second pitch spacing that is less than the at least one first pitch spacing. The space transformers also include a plurality of electrically conductive signal-transfer traces supported by the dielectric body. Each electrically conductive signal-transfer trace extends between, and electrically interconnects, a corresponding first electrical contact of the plurality of first electrical contacts and a corresponding second electrical contact of the plurality of second electrical contacts. The space transformers also include an electrically conductive radio frequency (RF) signal-modifying trace, which is in electrical communication with an RF signal-modifying second electrical contact of the plurality of second electrical contacts and is configured to convey an RF electrical signal in electrical communication with the DUT. The space transformers further include an RF electrical signal-modifying structure in electrical communication with the electrically conductive RF signal-modifying trace. The RF electrical signal-modifying structure is configured to receive the RF electrical signal from an input region of the electrically conductive RF signal-modifying trace and to discharge a modified RF electrical signal to an output region of the electrically conductive RF signal-modifying trace. The RF electrical signal-modifying structure includes a coupler configured to receive the RF electrical signal in the form of a first RF electrical signal from the DUT, to receive a second RF electrical signal from the DUT, and to couple the first RF electrical signal and the second RF electrical signal to one another to generate the modified RF electrical signal in the form of a first modified RF electrical signal and also to generate a second modified RF electrical signal.

DETAILED DESCRIPTION AND BEST MODE OF THE DISCLOSURE

FIGS. 1-8 provide examples of probe systems 10, of probe head assemblies 100, of space transformers 110, and/or of methods 300, according to the present disclosure. Elements that serve a similar, or at least substantially similar, purpose are labeled with like numbers in each of FIGS. 1-8, and these elements may not be discussed in detail herein with reference to each of FIGS. 1-8. Similarly, all elements may not be labeled in each of FIGS. 1-8, but reference numerals associated therewith may be utilized herein for consistency. Elements, components, and/or features that are discussed herein with reference to one or more of FIGS. 1-8 may be included in and/or utilized with any of FIGS. 1-8 without departing from the scope of the present disclosure. In general, elements that are likely to be included in a particular embodiment are illustrated in solid lines, while elements that are optional are illustrated in dashed lines. However, elements that are shown in solid lines may not be essential to all embodiments and, in some embodiments, may be omitted without departing from the scope of the present disclosure.

Figure 1:
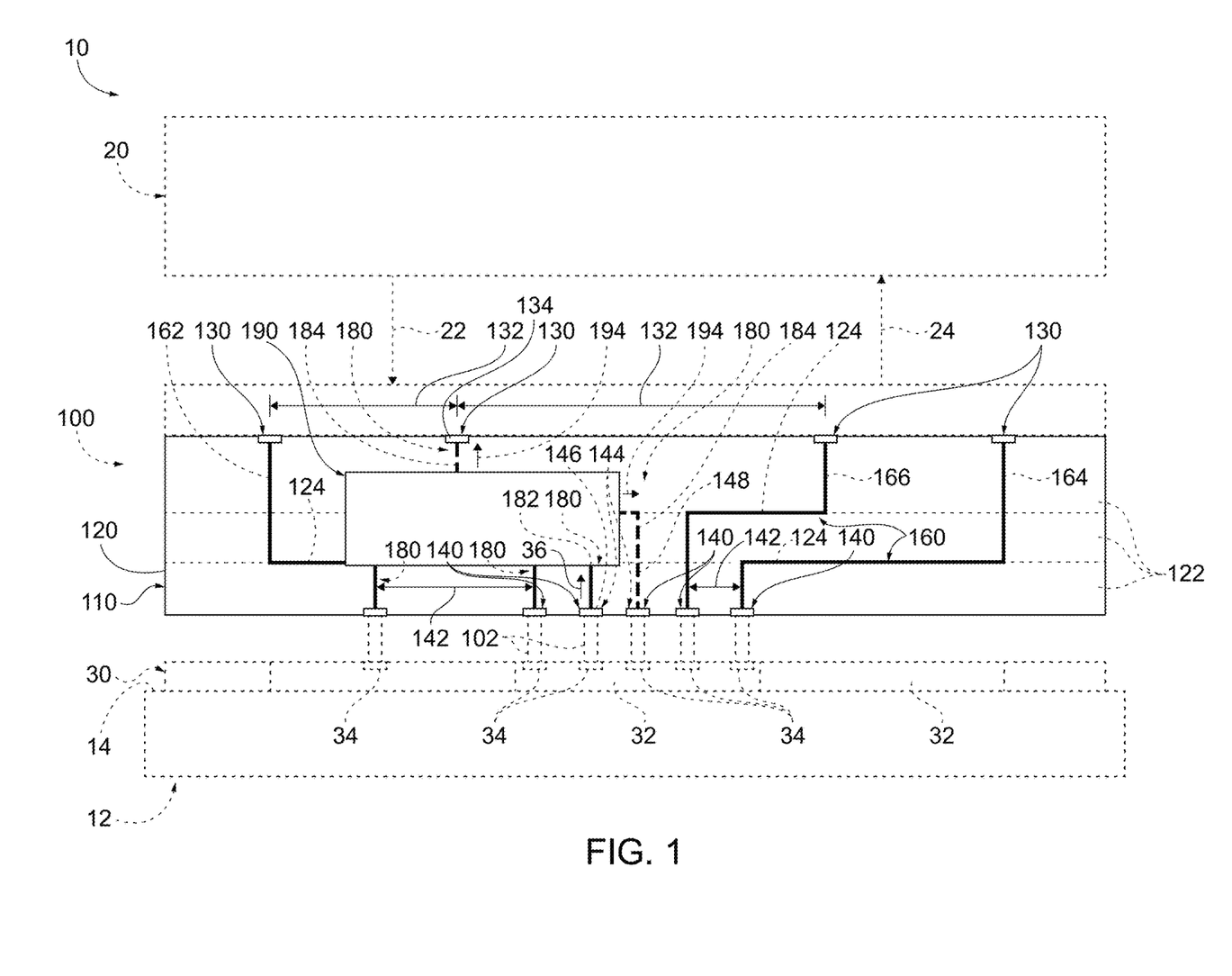
FIG. 1 is a schematic illustration of examples of a space transformer that may be included in a probe head assembly of a probe system, according to the present disclosure.
Figure 2:
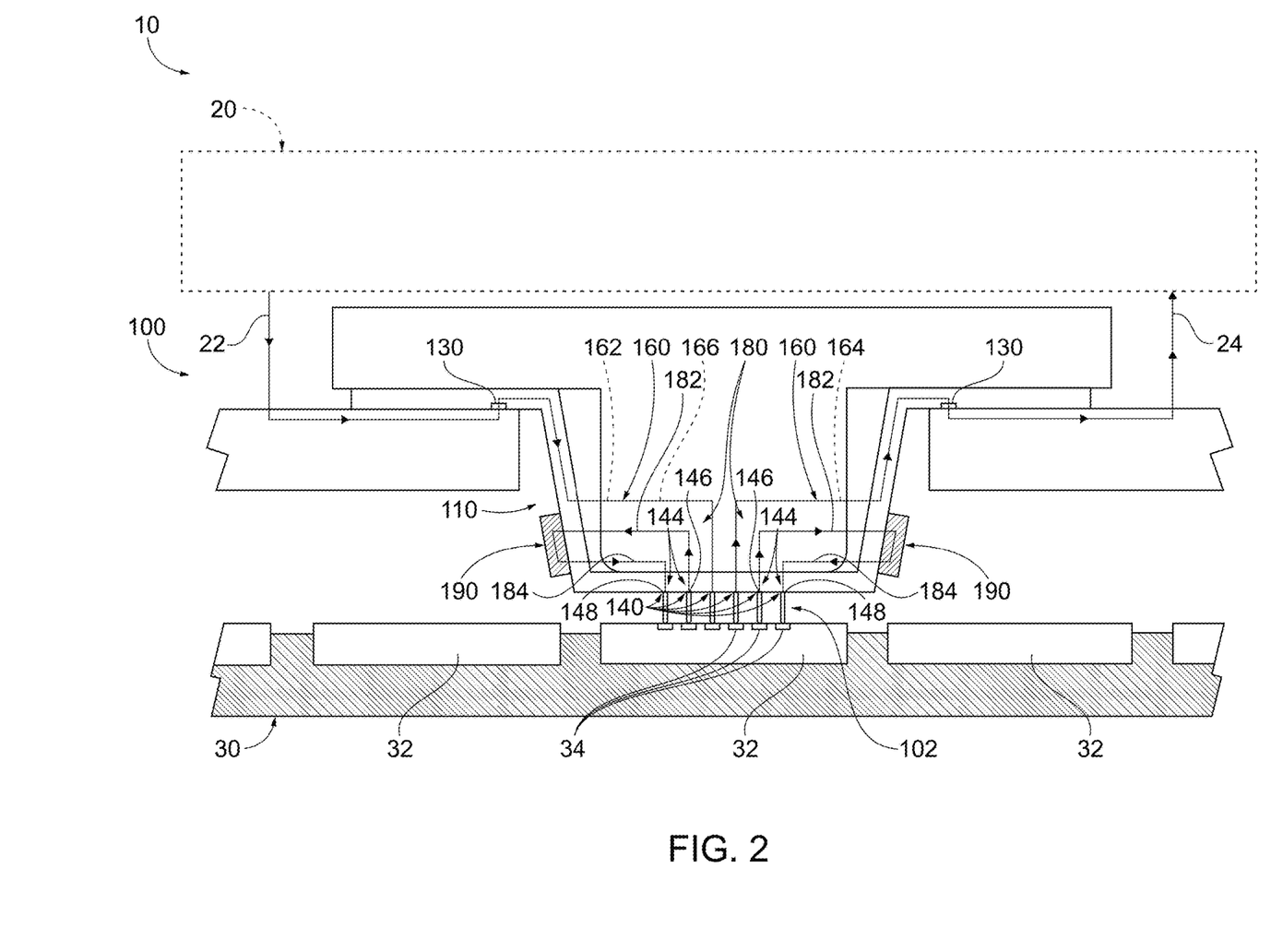
FIG. 2 is a more specific illustration of an example of a portion of a probe system that includes a probe head assembly that includes a space transformer, according to the present disclosure.
Figure 3:
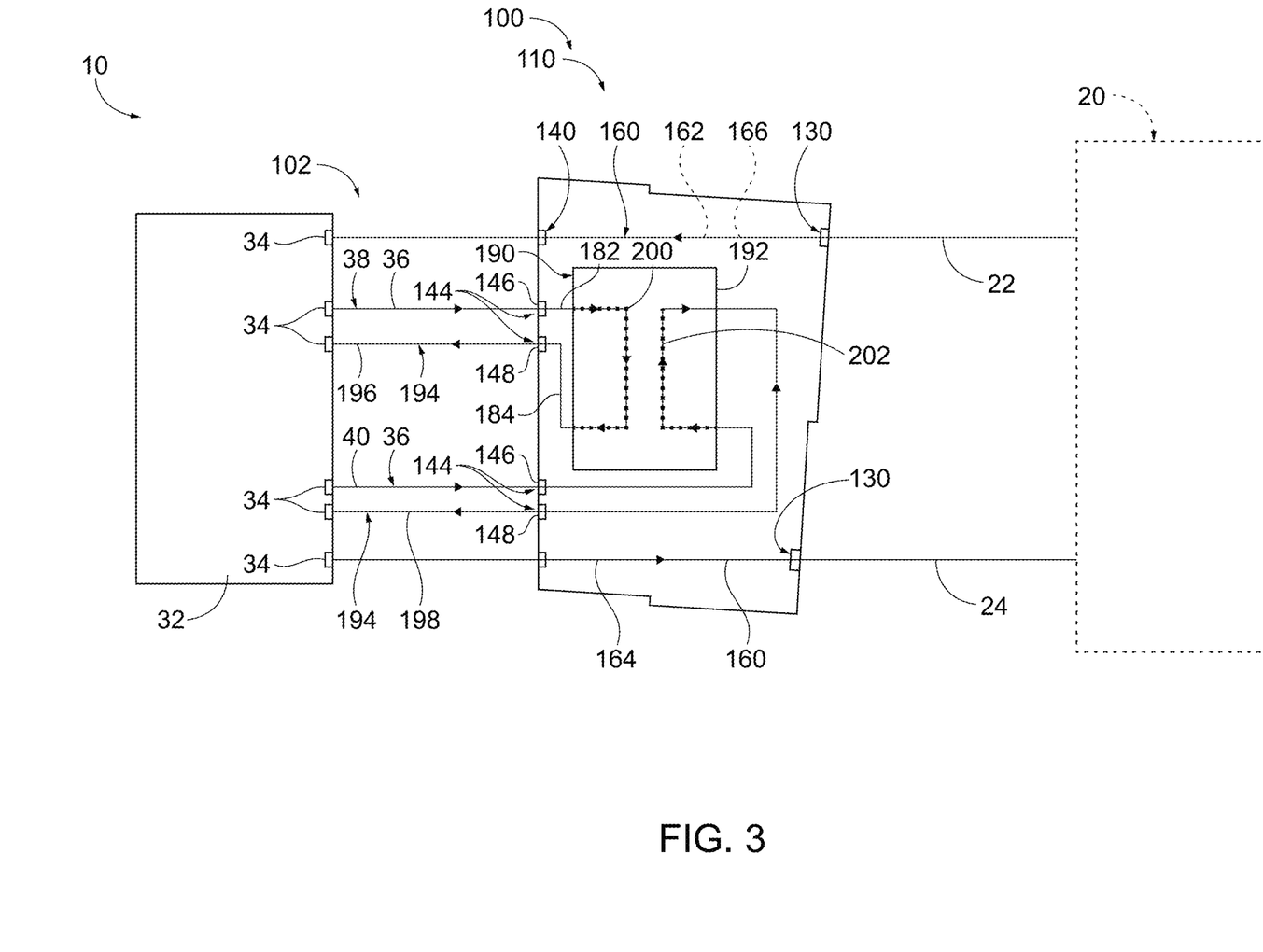
FIG. 3 is a more specific illustration of an example of a portion of a probe system that includes a probe head assembly that includes a space transformer, according to the present disclosure.

FIG. 1 is a schematic illustration of examples of a space transformer 110 that may be included in a probe head assembly 100 of a probe system 10, according to the present disclosure, while FIGS. 2-3 are more specific illustrations of examples of portions of probe systems 10 that include a probe head assembly 100 that includes a space transformer 110, according to the present disclosure.

As collectively illustrated by FIGS. 1-3, and with specific reference to FIG. 1, space transformers 110 include a dielectric body 120, a plurality of first electrical contacts 130, and a plurality of second electrical contacts 140. First electrical contacts 130 are supported by dielectric body 120 and arranged with at least one first pitch spacing 132, and second electrical contacts 140 are supported by dielectric body 120 and arranged with at least one second pitch spacing 142 that differs from, or is less than, the at least one first pitch spacing.

Space transformers 110 also include a plurality of electrically conductive signal-transfer traces 160. Each electrically conductive signal-transfer trace 160, which also may be referred to herein as a transfer trace 160, extends between, and electrically interconnects, a corresponding first electrical contact 130 and a corresponding second electrical contact 140. Stated differently, transfer traces 160 are configured to convey electrical signals through space transformers 110 and/or between first electrical contacts 130 and second electrical contacts 140.

Space transformers 110 also include at least one electrically conductive radio frequency (RF) signal-modifying trace 180. Electrically conductive RF signal-modifying trace 180 also may be referred to herein as a signal-modifying trace 180, is in electrical communication with an RF signal-modifying second electrical contact 144 of second electrical contacts 140, and/or is configured to convey an RF, or millimeter wave (mmWave), electrical signal in electrical communication with a device under test (DUT) 32.

Space transformers 110 further include an RF electrical signal-modifying structure 190. RF electrical signal-modifying structure 190 also may be referred to herein as a signal-modifying structure 190, is configured to receive the RF electrical signal from an input region 182 of signal-modifying trace 180, and/or is configured to discharge a modified RF electrical signal to an output region 184 of the signal-modifying trace.

With continued general reference to FIGS. 1-3, and with specific reference to FIG. 1, space transformers 110 may be utilized, within probe systems 10, to facilitate electrical communication with DUT 32, which may be formed on a substrate 30. Examples of DUT 32 include a semiconductor device, an electronic device, and/or an optoelectronic device. Examples of substrate 30 include a wafer, a silicon wafer, and a semiconductor wafer.

Probe systems 10 include a chuck 12 that defines a support surface 14. Support surface 14 may be configured to support DUT 32 and/or substrate 30. Examples of chuck 12 include a vacuum chuck, a temperature-controlled chuck, and/or an electrically shielded chuck.

Probe systems 10 also include a probe head assembly 100 that includes space transformer 110. Probe systems 10 further include a signal generation and analysis assembly 20, which may be configured to provide a test signal 22 to DUT 32 via space transformer 110 and/or to receive a resultant signal 24 from the DUT via the space transformer. Examples of signal generation and analysis assembly 20 include a power supply, a DC power supply, an AC power supply, a function generator, an RF signal generator, a signal analyzer, and/or an RF signal analyzer.

During operation of probe systems 10 and/or during testing of a DUT 32 utilizing probe systems 10 that include space transformers 110, such as via methods 300, an electric power signal may be provided to the DUT, such as via the space transformer. As an example, signal generation and analysis assembly 20 may generate test signal 22 in the form of the electric power signal, which may be provided to DUT 32 via probe head assembly 100, space transformer 110, and/or probes 102.

An RF electrical signal also may be received by the space transformer. As an example, and responsive to receipt of the electric power signal, DUT 32 may generate an RF electrical signal 36, which may be received by space transformer 110, such as via RF signal-modifying second electrical contact 144. The RF electrical signal then may be modified, within space transformer 110 and utilizing RF electrical signal-modifying structure 190, to generate a modified RF electrical signal 194.

As an example, input region 182 of signal-modifying trace 180 may receive RF electrical signal 36 from RF signal-modifying second electrical contact 144 and may provide the RF electrical signal to signal-modifying structure 190. Signal-modifying structure 190 may receive the RF electrical signal, may modify the RF electrical signal to generate modified RF electrical signal 194, and then may provide the modified RF electrical signal to output region 184 of signal-modifying trace 180.

In some examples, and as illustrated in FIG. 1, output region 184 may be in electrical communication with a corresponding RF signal-modifying first electrical contact 134 and/or may provide the modified RF electrical signal to signal generation and analysis assembly 20 via the RF signal-modifying first electrical contact. Additionally or alternatively, and as illustrated in FIGS. 1-3, second electrical contacts 140 may include at least two RF signal-modifying second electrical contacts 144 in the form of an RF signal-receiving second electrical contact 146 and an RF signal-discharging second electrical contact 148. In such examples, input region 182 may receive RF electrical signal 36 from RF signal-receiving second electrical contact 146 and may return the modified RF electrical signal to the DUT via output region 184 and RF signal-discharging second electrical contact 148.

Modification of RF electrical signal 36 to generate modified RF electrical signal 194 within space transformer 110 and/or return of modified RF electrical signal 194 to DUT 32 may provide several distinct benefits over conventional probe systems that do not modify the RF electrical signal within the space transformer and/or that do not return the modified RF electrical signal to the DUT. As an example, a distance that the RF electrical signal travels and/or that the modified RF electrical signal travels may be shorter when compared to such conventional probe systems. This may permit and/or facilitate decreased distance, resistance, inductance, and/or capacitance-based performance degradation in the RF electrical signal and/or in the modified RF electrical signal when compared to such conventional probe systems. As another example, probe systems 10 that include space transformers 110 may permit and/or facilitate electrical testing of DUTs 32 under circumstances that more closely approximate real-world use cases for the DUTs when compared to electrical testing that may be performed by such conventional probe systems. As yet another example, selection and/or tuning of structures included within signal-modifying structure 190, such as are disclosed herein, may permit and/or facilitate performance tuning of probe systems 10 at a level that may be inaccessible to such conventional probe systems. As another example, return of modified RF electrical signal 194 to DUT 32 may decrease a need for external tester resources within probe system 10 and/or signal generation and analysis assembly 20 thereof, which may decrease a cost and/or complexity of the probe system.

Returning more generally to FIGS. 1-3, dielectric body 120 may include and/or be any suitable body that supports first electrical contacts 130, that supports second electrical contacts 140, that supports transfer traces 160, that supports signal-modifying trace 180, that supports signal-modifying structure 190, that spatially separates one or more of these structures from one or more other of these structures, and/or that electrically isolates one or more of these structures from one or more other of these structures. As an example, dielectric body 120 may include and/or may be defined by a dielectric material and/or by an electrically insulating material.

It is within the scope of the present disclosure that dielectric body 120 may include and/or be a rigid, or at least partially rigid, dielectric body. Additionally or alternatively, it is also within the scope of the present disclosure that dielectric body 120 may include and/or be flexible, an at least partially flexible, a resilient, and/or an at least partially resilient dielectric body. Examples of dielectric body 120 include a dielectric membrane, a polyimide dielectric body, a polyimide dielectric membrane, an organic dielectric body, a multi-layer organic (MLO) dielectric body, an inorganic dielectric body, a ceramic dielectric body, a multi-layer ceramic (MLC) dielectric body, a single-layer dielectric body, and/or a multi-layer dielectric body, such as may include a plurality of layers 122, as illustrated in FIG. 1.

First electrical contacts 130 may include any suitable structure that may be supported by dielectric body 120, that may define the at least one first pitch spacing 132, that may define a plurality of different first pitch spacings 132, and/or that may function as an electrical interface between space transformer 110 and one or more other components of probe system 10. Examples of first electrical contacts 130 include a plurality of first electrical contact pads, a plurality of first electrical contact tips, a plurality of first electrically conductive bodies, a plurality of first electrically conductive regions, a plurality of first metallic bodies, and/or a plurality of first metallic regions.

As discussed, first pitch spacing 132, or an average of the plurality of different first pitch spacings 132, may differ from second pitch spacing 142, or from an average of a plurality of different second pitch spacings 142. In particular, first pitch spacing 132 may be greater than second pitch spacing 142, and/or second pitch spacing 142 may be less than first pitch spacing 132. As an example, the first pitch spacing may be at least a threshold pitch spacing multiple of the second pitch spacing. Examples of the threshold pitch spacing multiple include 2, 3, 4, 5, 10, 15, 20, 30, 40, 50, 75, or 100.

Similarly, second electrical contacts 140 may include any suitable structure that may be supported by dielectric body 120, that may define the at least one second pitch spacing 142, that may define the plurality of different second pitch spacings 142, and/or that may function as an electrical interface between space transformer 110 and DUT 32 and/or between the space transformer and one or more other components of probe system 10. Examples of second electrical contacts 140 include a plurality of second electrical contact pads, a plurality of second electrical contact tips, a plurality of second electrical probe tips, a plurality of second electrically conductive bodies, a plurality of second electrically conductive regions, a plurality of second metallic bodies, and/or a plurality of second metallic regions.

In some examples, second electrical contacts 140 may be configured to contact, or to directly contact, DUT 32, such as via contacting DUT contact pads 34 of DUT 32. In such examples, second electrical contacts 140 may be referred to herein as and/or may be probes 102 of probe head assembly 100. In some examples, second electrical contacts 140 may be configured to indirectly contact DUT 32, such as via probes 102 that are in electrical communication with second electrical contacts 140. Such configurations may permit and/or facilitate electrical communication between probe system 10 and DUT 32.

Transfer traces 160 may include any suitable structure that may be supported by dielectric body 120, that may extend between the corresponding first electrical contact and the corresponding second electrical contact, and/or that may electrically interconnect the corresponding first electrical contact and the corresponding second electrical contact. Examples of transfer traces 160 include a metallic signal-transfer trace, an aluminum signal-transfer trace, and/or a copper signal-transfer trace.

One or more signal-transfer traces 160 may be configured to provide an electric power signal 166 to DUT 32, such as to electrically power the DUT. Examples of the electric power signal include direct current (DC) electric power and/or alternating current (AC) electric power. Additionally or alternatively, one or more signal-transfer traces 160 may be configured to provide a corresponding RF input electric signal 162 to DUT 32 and/or to provide a corresponding RF output electric signal 164 from the DUT to one or more other components of probe systems 10.

Signal-modifying trace 180 may include any suitable structure that may be supported by dielectric body 120, that may define input region 182, that may define output region 184, that may be in electrical communication with RF signal-modifying first electrical contact 134, that may be in electrical communication with RF signal-modifying second electrical contact 144, that may be in electrical communication with RF signal-receiving second electrical contact 146, that may be in electrical communication with RF signal-discharging second electrical contact 148, and/or that may be in electrical communication with signal-modifying structure 190. Examples of signal-modifying trace 180 include a metallic signal-modifying trace, an aluminum signal-modifying trace, and/or a copper signal-modifying trace. In some examples, space transformer 110 includes one, or a single, signal-modifying trace 180 and corresponding signal-modifying structure 190. However, this is not required of all examples, and space transformer 110 may, in some examples, include a plurality of signal-modifying traces 180 and a corresponding plurality of signal-modifying structures 190.

Signal-modifying structure 190 may include any suitable structure that may be supported by dielectric body 120, that may be in communication with signal-modifying trace 180, that may be configured to receive the RF electrical signal from input region 182, that may be configured to generate the modified RF electrical signal, and/or that may be configured to output the modified RF electrical signal to output region 184. Signal-modifying structure 190 may modify the RF electrical signal and/or may generate the modified RF electrical signal in any suitable manner. As examples, signal-modifying structure 190 may be configured to direct the RF electrical signal to output region 184 as modified RF electrical signal 194, to reflect the RF electrical signal to the output region as the modified RF electrical signal, to change a frequency of the RF electrical signal to generate the modified RF electrical signal, to change a bandwidth of the RF electrical signal to generate the modified RF electrical signal, to split the RF electrical signal to generate the modified RF electrical signal, to amplify the RF electrical signal to generate the modified RF electrical signal, to couple the RF electrical signal with another signal to generate the modified RF electrical signal, and/or to combine the RF electrical signal with another signal to generate the modified RF electrical signal.

Examples of signal-modifying structure 190 include a passive RF structure, a complex passive RF structure, an RF attenuator, an RF coupler, a resistor, a capacitor, an inductor, and/or a splitter. In some examples, signal-modifying structure 190 may be surface mounted to dielectric body 120 and/or to at least one other structure of space transformer 110, as illustrated in FIGS. 1-2. Additionally or alternatively, signal-modifying structure 190 may include and/or be a built-in component that may be built into and/or encapsulated within dielectric body 120 and/or space transformer 110, such as being formed within and/or by a metallization layer 124, which may be formed between adjacent layers 122 of the space transformer, as illustrated in FIGS. 1 and 3.

FIGS. 3-7 illustrate more specific examples of signal-modifying structures 190 that may be included in and/or utilized with space transformers 110, according to the present disclosure. More specifically, FIGS. 3-7 illustrate examples of signal-modifying structures 190 in the form of couplers 192, or passive couplers, that may be utilized to couple two signals to one another via coupling interactions between the two signals and/or without the use of, or need for, other and/or external signals and/or energy sources.

As an example, and as illustrated in FIG. 3, signal-modifying structure 190 may be configured to receive a first 38 RF electrical signal 36 from a corresponding DUT contact pad 34 of DUT 32, such as via a corresponding RF signal-receiving second electrical contact 146, and also to receive a second 40 RF electrical signal 36 from a different corresponding contact pad of the DUT, such as via another corresponding RF signal-receiving second electrical contact 146. The first RF electrical signal and the second RF electrical signal may be coupled to one another, within signal-modifying structure 190, thereby generating a first 196 modified RF electrical signal 194, which may be returned to another corresponding contact pad 34 of the DUT, such as via a corresponding RF signal-discharging second electrical contact 148, and a second 198 modified RF electrical signal 194, which also may be returned to yet another corresponding contact pad 34 of the DUT, such as via another corresponding RF signal-discharging second electrical contact 148.

The coupling between the first RF electrical signal and the second RF electrical signal may be accomplished in any suitable manner. As examples, the coupling may be accomplished via capacitive, inductive, and/or electric field interaction between the first RF electrical signal and the second RF electrical signal. As a more specific example, coupler 192 may include a first transmission line 200, which is configured to convey the first RF electrical signal, and a second transmission line 202, which is configured to convey the second RF electrical signal. The first transmission line and the second transmission line may be positioned relatively proximate one another and/or close enough to facilitate coupling between the first RF electrical signal and the second RF electrical signal.

Figure 4:
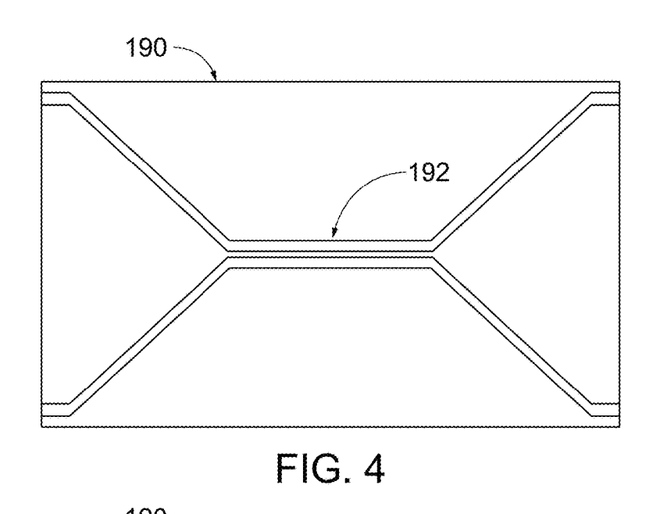
FIG. 4 is an example of a relatively lower frequency directional coupler that may be utilized in a space transformer, according to the present disclosure.
Figure 5:
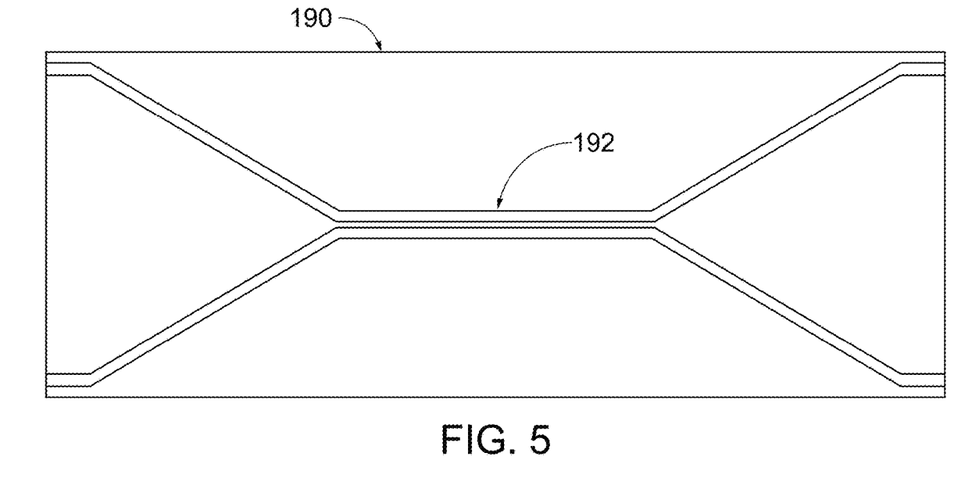
FIG. 5 is an example of a relatively higher frequency directional coupler that may be utilized in a space transformer, according to the present disclosure.
Figure 6:
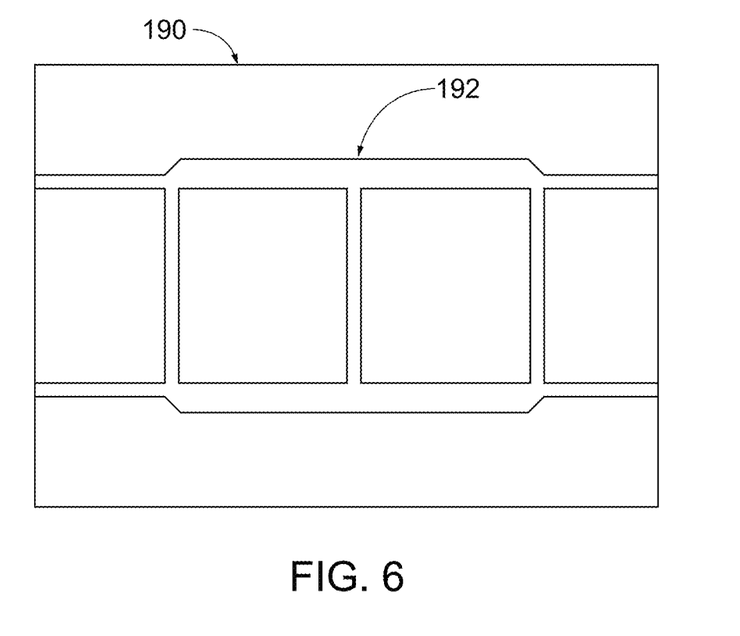
FIG. 6 is an example of a branchline coupler that may be utilized in a space transformer, according to the present disclosure.
Figure 7:
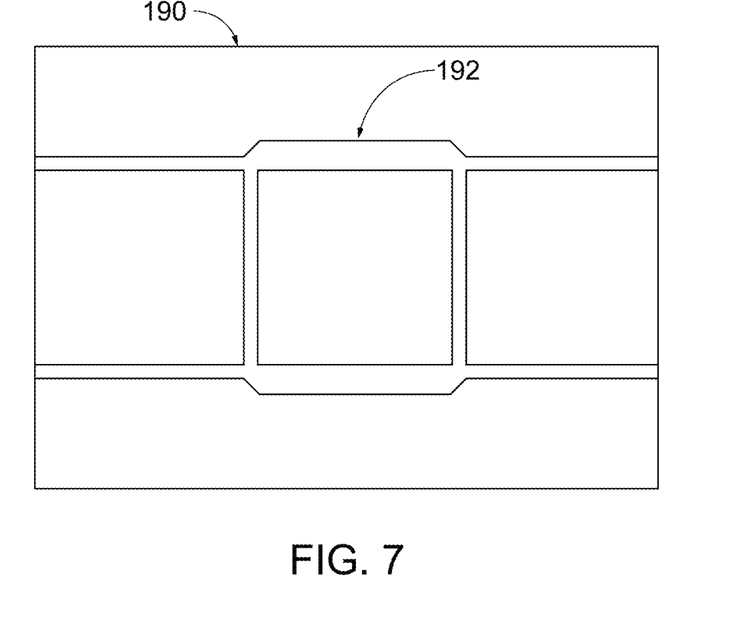
FIG. 7 is an example of a quadrature hybrid coupler that may be utilized in a space transformer, according to the present disclosure.
Figure 8:
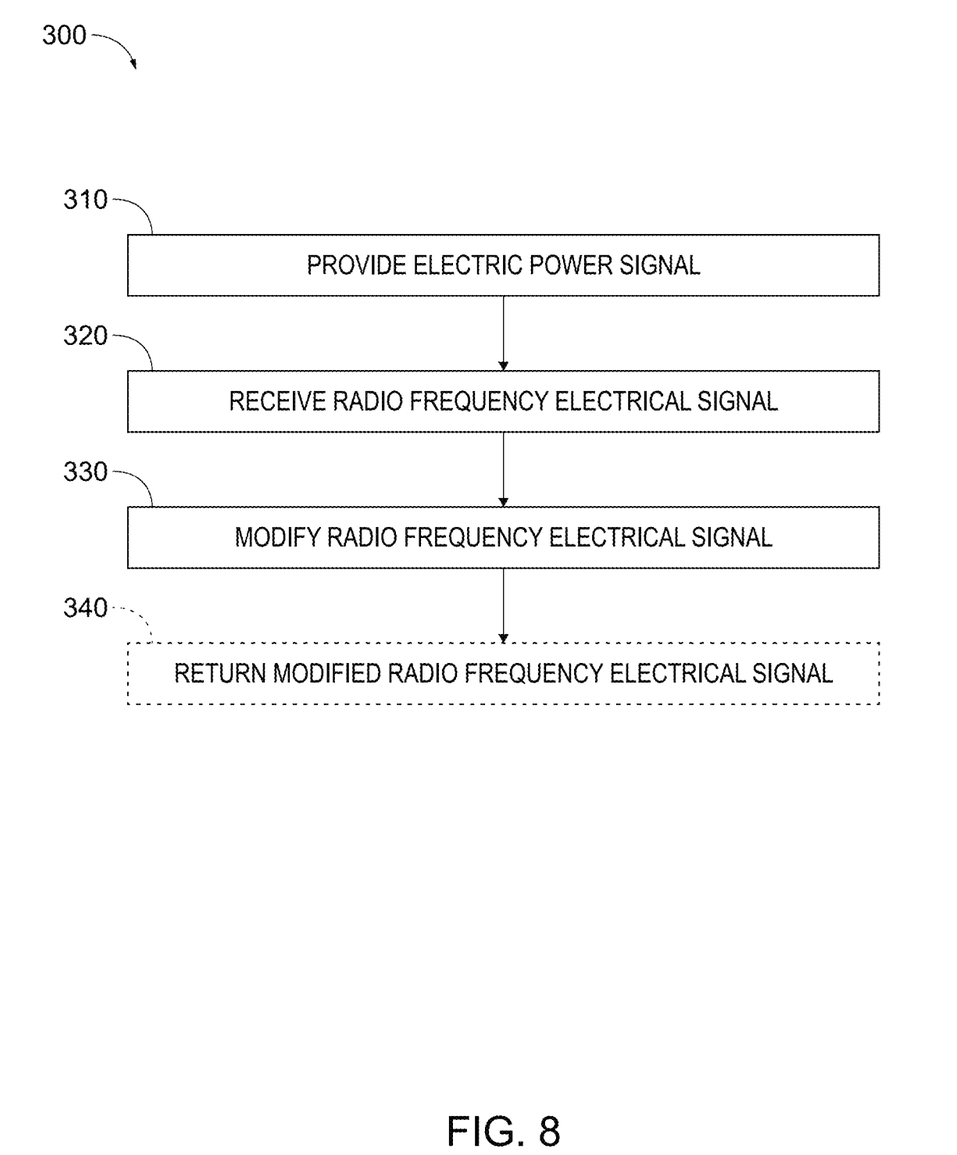
FIG. 8 is a flowchart depicting examples of methods of testing a device under test (DUT) utilizing a probe system that includes a space transformer, according to the present disclosure.

FIGS. 4-5 are examples of signal-modifying structure 190 in the form of directional couplers, with FIG. 4 illustrating a relatively lower frequency directional coupler that may be utilized in the configuration that is illustrated in FIG. 3, and with FIG. 5 illustrating a relatively higher frequency directional coupler that may be utilized in the configuration that is illustrated in FIG. 3. The relatively higher frequency directional coupler and/or the relatively lower frequency directional coupler may be selected and/or utilized to provide a desired coupling frequency and/or a desired coupling efficiency. FIG. 6 is an example of a signal-modifying structure 190 in the form of a branchline coupler that may be utilized in the configuration that is illustrated in FIG. 3. FIG. 8 is an example of a signal-modifying structure 190 in the form of a quadrature hybrid coupler that may be utilized in the configuration that is illustrated in FIG. 3.

FIG. 8 is a flowchart depicting examples of methods 300 of testing a device under test (DUT) utilizing a probe system that includes a space transformer, according to the present disclosure. Methods 300 include providing an electric power signal at 310 and receiving a radio frequency (RF) electrical signal at 320. Methods 300 also include modifying the RF electrical signal at 330 and may include returning a modified RF electrical signal at 340. Examples of the DUT, the probe system, and the space transformer are disclosed herein with reference to DUT 32, probe system 10, and space transformer 110, respectively.

Providing the electric power signal at 310 may include providing the electric power signal to the DUT. This may include providing the electric power signal with, via, and/or utilizing the space transformer. The providing at 310 may be performed in any suitable manner. As an example, and as discussed in more detail herein, the probe system may include a signal generation and analysis assembly, and the providing at 310 may include providing the electric power signal with, via, and/or utilizing the signal generation and analysis assembly. Examples of the signal generation and analysis assembly are disclosed herein with reference to signal generation and analysis assembly 20. Examples of the electric power signal are disclosed herein with reference to test signal 22. As another example, and as also discussed in more detail herein, the probe system may include a probe head assembly that includes a plurality of probes and the space transformer, and the providing at 310 may include providing with, via, and/or utilizing the probe head assembly and/or at least one probe of the plurality of probes. Examples of the probe head assembly and the plurality of probes are disclosed herein with reference to probe head assembly 100 and probes 102, respectively.

Receiving the RF electrical signal at 320 may include receiving the RF electrical signal from the DUT. The receiving at 320 may be performed responsive to the providing at 310 and/or may be performed with, via, and/or utilizing the space transformer. The receiving at 320 may be performed in any suitable manner. As an example, the receiving at 320 may include receiving the RF electrical signal from the DUT with, via, and/or utilizing the probe head assembly and/or at least one probe of the plurality of probes. Examples of the RF electrical signal are disclosed herein with reference to RF electrical signal 36.

Modifying the RF electrical signal at 330 may include modifying the RF electrical signal to produce and/or to generate the modified RF electrical signal. This may include modifying the RF electrical signal within the space transformer and/or modifying the RF electrical signal with, via, and/or utilizing an RF electrical signal-modifying structure of the space transformer. Examples of the RF electrical signal-modifying structure and of the modified RF electrical signal are disclosed herein with reference to RF electrical signal-modifying structure 190 and modified RF electrical signal 194, respectively.

Returning the modified RF electrical signal at 340 may include returning the modified RF electrical signal to the DUT. This may include returning the modified RF electrical signal to the DUT with, via, and/or utilizing the space transformer, the probe head assembly, and/or at least one probe of the plurality of probes.

In some examples, the RF electrical signal may include and/or be a first RF electrical signal, examples of which are disclosed herein with reference to first RF electrical signal 38, and the modified RF electrical signal may include and/or be a first modified RF electrical signal, examples of which are disclosed herein with reference to first modified RF electrical signal 196. In some such examples, the receiving at 320 further may include receiving a second RF electrical signal from the DUT, and the modifying at 330 further may include modifying the second RF electrical signal, within the space transformer and utilizing the RF electrical signal-modifying structure, to generate a second modified RF electrical signal. Examples of the second RF electrical signal and the second modified RF electrical signal are disclosed herein with reference to second RF electrical signal 40 and second modified RF electrical signal 198, respectively. In some such examples, the modifying at 330 may include coupling the first RF electrical signal and the second RF electrical signal to one another to produce and/or generate the first modified RF electrical signal and the second modified RF electrical signal. Also in some such examples, the returning at 340 may include returning the second modified RF electrical signal to the DUT via the space transformer.

Methods 300 may provide distinct benefits over conventional methods that do not modify the RF electrical signal within the space transformer, that do not return the modified RF electrical signal to the DUT, and/or that do not couple the first RF electrical signal and the second RF electrical signal to one another to produce and/or generate the first modified RF electrical signal and the second modified RF electrical signal. As an example, methods 300 may permit and/or facilitate shorter transmission distances for corresponding RF electrical signals when compared to the conventional methods, which may improve signal-to-noise ratios and/or may permit testing of DUTs that could not be tested, or reliably tested, utilizing the conventional methods. As another example, modification of RF electrical signals within the space transformer, such as via coupling the first RF electrical signal and the second RF electrical signal to one another, may decrease the need for external tester resources and/or may permit and/or facilitate testing, or concurrent testing, of additional DUTs, which may decrease the cost and/or complexity of methods 300 when compared to the conventional methods.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of space transformers, probe systems, and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A space transformer configured to be utilized in a probe system to facilitate electrical communication with a device under test (DUT), the space transformer comprising:
a dielectric body;
a plurality of first electrical contacts supported by the dielectric body and arranged with at least one first pitch spacing;
a plurality of second electrical contacts supported by the dielectric body and arranged with at least one second pitch spacing that is less than the at least one first pitch spacing;
a plurality of electrically conductive signal-transfer traces supported by the dielectric body, wherein each electrically conductive signal-transfer trace of the plurality of electrically conductive signal-transfer traces extends between, and electrically interconnects, a corresponding first electrical contact of the plurality of first electrical contacts and a corresponding second electrical contact of the plurality of second electrical contacts;
an electrically conductive radio frequency (RF) signal-modifying trace in electrical communication with an RF signal-modifying second electrical contact of the plurality of second electrical contacts and configured to convey an RF electrical signal in electrical communication with the DUT; and
an RF electrical signal-modifying structure in electrical communication with the electrically conductive RF signal-modifying trace and configured to receive the RF electrical signal from an input region of the electrically conductive RF signal-modifying trace and to discharge a modified RF electrical signal to an output region of the electrically conductive RF signal-modifying trace.

A2. The space transformer of paragraph A1, wherein the dielectric body includes, or is, a rigid dielectric body.

A3. The space transformer of any of paragraphs A1-A2, wherein the dielectric body includes, or is, a flexible dielectric body.

A4. The space transformer of any of paragraphs A1-A3, wherein the dielectric body includes, or is, a dielectric membrane.

A5. The space transformer of any of paragraphs A1-A4, wherein the dielectric body includes, or is, a polyimide dielectric body.

A6. The space transformer of any of paragraphs A1-A5, wherein the dielectric body includes, or is, a multi-layer organic (MLO) dielectric body.

A7. The space transformer of any of paragraphs A1-A6, wherein the dielectric body includes, or is, an organic dielectric body.

A8. The space transformer of any of paragraphs A1-A7, wherein the dielectric body includes, or is, a ceramic dielectric body.

A9. The space transformer of any of paragraphs A1-A8, wherein the dielectric body includes, or is, a multi-layer ceramic (MLC) dielectric body.

A10. The space transformer of any of paragraphs A1-A9, wherein the dielectric body includes, or is, a layered dielectric body.

A11. The space transformer of any of paragraphs A1-A10, wherein the plurality of first electrical contacts includes, or is, a plurality of first electrical contact pads.

A12. The space transformer of any of paragraphs A1-A11, wherein the plurality of first electrical contacts includes, or is, a plurality of first electrical contact tips.

A13. The space transformer of any of paragraphs A1-A12, wherein the at least one first pitch spacing, or an average of a plurality of different first pitch spacings, is at least a threshold pitch spacing multiple of the at least one second pitch spacing, or of an average of a plurality of different second pitch spacings, wherein the threshold pitch spacing multiple is 2, 3, 4, 5, 10, 15, 20, 30, 40, 50, 75, or 100.

A14. The space transformer of any of paragraphs A1-A13, wherein the plurality of second electrical contacts includes, or is, a plurality of second electrical contact pads.

A15. The space transformer of any of paragraphs A1-A14, wherein the plurality of second electrical contacts includes, or is, a plurality of second electrical contact tips, or probe tips.

A16. The space transformer of any of paragraphs A1-A15, wherein the plurality of second electrical contacts is configured to directly contact the DUT to facilitate electrical communication between the probe system and the DUT.

A17. The space transformer of any of paragraphs A1-A16, wherein the plurality of electrically conductive signal-transfer traces includes, or is, a plurality of metallic signal-transfer traces.

A18. The space transformer of any of paragraphs A1-A17, wherein at least one signal-transfer trace of the plurality of electrically conductive signal-transfer traces is configured to provide an electric power signal from the probe system to the DUT.

A19. The space transformer of paragraph A18, wherein the electric power signal includes at least one of direct current electric power and alternating current electric power.

A20. The space transformer of any of paragraphs A1-A19, wherein at least one signal-transfer trace of the plurality of electrically conductive signal-transfer traces is configured to provide a corresponding RF input electric signal from the probe system to the DUT.

A21. The space transformer of any of paragraphs A1-A20, wherein at least one signal-transfer trace of the plurality of electrically conductive signal-transfer traces is configured to provide a corresponding RF output electric signal from the DUT to the probe system.

A22. The space transformer of any of paragraphs A1-A21, wherein the electrically conductive RF signal-modifying trace includes, or is, a metallic signal-modifying trace.

A23. The space transformer of any of paragraphs A1-A22, wherein the space transformer includes a plurality of electrically conductive RF signal-modifying traces and a corresponding plurality of RF electrical signal-modifying structures.

A24. The space transformer of any of paragraphs A1-A23, wherein the output region is in electrical communication with an RF signal-modifying first electrical contact of the plurality of first electrical contacts and is configured to convey the modified RF electrical signal to a signal generation and analysis assembly of the probe system.

A25. The space transformer of any of paragraphs A1-A23, wherein the RF signal-modifying second electrical contact is an RF signal-receiving second electrical contact that is in electrical communication with the input region, wherein the plurality of second electrical contacts includes an RF signal-discharging second electrical contact that is in communication with the output region, and further wherein the electrically conductive RF signal-modifying trace is configured to receive the RF electrical signal from the DUT via the RF signal-receiving second electrical contact and to provide the modified RF electrical signal to the DUT via the RF signal-discharging second electrical contact.

A26. The space transformer of any of paragraphs A1-A25, wherein the RF electrical signal-modifying structure includes, or is, a coupler configured to receive the RF electrical signal in the form of a first RF electrical signal from the DUT, to receive a second RF electrical signal from the DUT, to couple the first RF electrical signal and the second RF electrical signal to one another to generate the modified RF electrical signal in the form of a first modified RF electrical signal, and also to generate a second modified RF electrical signal.

A27. The space transformer of paragraph A26, wherein the space transformer is configured such that the RF electrical signal-modifying structure receives the first RF electrical signal from the DUT via a corresponding RF signal-receiving second electrical contact of the plurality of second electrical contacts and receives the second RF electrical signal from the DUT via another corresponding RF signal-receiving second electrical contact of the plurality of second electrical contacts.

A28. The space transformer of any of paragraphs A26-A27, wherein the space transformer is configured to return the first modified RF electrical signal and the second modified RF electrical signal to the DUT, or to corresponding DUT contact pads of the DUT.

A29. The space transformer of any of paragraphs A26-A28, wherein the space transformer is configured such that the RF electrical signal-modifying structure returns the first modified RF electrical signal to the DUT via a corresponding RF signal-discharging second electrical contact of the plurality of second electrical contacts and returns the second modified RF electrical signal to the DUT via another corresponding RF signal-discharging second electrical contact of the plurality of second electrical contacts.

A30. The space transformer of any of paragraphs A26-A29, wherein the coupler is configured to couple the first RF electrical signal and the second RF electrical signal to one another via at least one of:
(i) a capacitive interaction between the first RF electrical signal and the second RF electrical signal;
(ii) an inductive interaction between the first RF electrical signal and the second RF electrical signal; and
(iii) an electric field interaction between the first RF electrical signal and the second RF electrical signal.

A31. The space transformer of any of paragraphs A26-A30, wherein the coupler includes a first transmission line, which is configured to convey the first RF electrical signal, and a second transmission line, which is configured to convey the second RF electrical signal, wherein the first transmission line and the second transmission line are positioned relatively proximate one another to facilitate coupling between the first RF electrical signal and the second RF electrical signal.

A32. The space transformer of any of paragraphs A26-A31, wherein the coupler includes, or is, a directional coupler.

A33. The space transformer of any of paragraphs A26-A32, wherein the coupler includes, or is, a branchline coupler.

A34. The space transformer of any of paragraphs A26-A33, wherein the coupler includes, or is, a quadrature hybrid coupler.

A35. The space transformer of any of paragraphs A26-A34, wherein the coupler includes, or is, a passive coupler.

A36. The space transformer of any of paragraphs A1-A35, wherein the RF electrical signal-modifying structure includes, or is, a passive RF structure.

A37. The space transformer of any of paragraphs A1-A36, wherein the RF electrical signal-modifying structure includes, or is, a complex passive RF structure.

A38. The space transformer of any of paragraphs A1-A37, wherein the RF electrical signal-modifying structure includes, or is, an RF attenuator.

A39. The space transformer of any of paragraphs A1-A38, wherein the RF electrical signal-modifying structure includes, or is, an RF coupler.

A40. The space transformer of any of paragraphs A1-A39, wherein the RF electrical signal-modifying structure includes, or is, a resistor.

A41. The space transformer of any of paragraphs A1-A40, wherein the RF electrical signal-modifying structure includes, or is, a capacitor.

A42. The space transformer of any of paragraphs A1-A41, wherein the RF electrical signal-modifying structure includes, or is, an inductor.

A43. The space transformer of any of paragraphs A1-A42, wherein the RF electrical signal-modifying structure includes, or is, a splitter.

A44. The space transformer of any of paragraphs A1-A43, wherein the RF electrical signal-modifying structure includes, or is, a surface-mount component that is surface mounted to the dielectric body.

A45. The space transformer of any of paragraphs A1-A44, wherein the RF electrical signal-modifying structure includes, or is, a built-in component that is built into the dielectric body, optionally wherein the RF electrical signal-modifying structure is formed within a metallization layer of the space transformer.

A46. The space transformer of any of paragraphs A1-A45, wherein the space transformer includes any suitable structure, function, and/or feature of any of the space transformers that are illustrated and/or described herein.

B1. A probe system configured to test a device under test (DUT), the probe system comprising:
a chuck that defines a support surface configured to support a substrate that includes the DUT;
a probe head assembly that includes the space transformer of any of paragraphs A1-A46; and
a signal generation and analysis assembly configured to at least one of:
(i) provide a test signal to the DUT via the space transformer; and
(ii) receive a resultant signal from the DUT via the space transformer.

B2. The probe system of paragraph B1, wherein at least one of:
(i) the probe system includes the DUT; and
(ii) the probe system includes the substrate that includes the DUT.

B3. The probe system of paragraph B2, wherein the substrate is positioned on the support surface of the chuck.

B4. The probe system of any of paragraphs B1-B3, wherein the chuck includes at least one of a vacuum chuck, a temperature-controlled chuck, and an electrically shielded chuck.

B5. The probe system of any of paragraphs B1-B4, wherein the probe head assembly includes a plurality of probes configured to electrically contact corresponding DUT contact pads of the DUT.

B6. The probe system of paragraph B5, wherein the plurality of probes at least one of:
(i) is defined by the plurality of second electrical contacts; and
(ii) is configured to electrically connect a corresponding second electrical contact of the plurality of second electrical contacts with the corresponding DUT contact pad.

C1. A method of testing a device under test (DUT) utilizing a probe system that includes a space transformer, the method comprising:
providing an electric power signal to the DUT via the space transformer;
responsive to the providing and with the space transformer, receiving a radio frequency (RF) electrical signal from the DUT; and
modifying the RF electrical signal, within the space transformer and utilizing an RF electrical signal-modifying structure of the space transformer, to generate a modified RF electrical signal.

C2. The method of paragraph C1, wherein the method further includes returning the modified RF electrical signal to the DUT via the space transformer.

C3. The method of paragraph C2, wherein the RF electrical signal is a first RF electrical signal, wherein the modified RF electrical signal is a first modified RF electrical signal, wherein the receiving includes receiving a second RF electrical signal from the DUT, and further wherein the modifying includes modifying the second RF electrical signal, within the space transformer and utilizing the RF electrical signal-modifying structure, to generate a second modified RF electrical signal.

C4. The method of paragraph C3, wherein the returning includes returning the second modified RF electrical signal to the DUT via the space transformer.

C5. The method of any of paragraphs C3-C4, wherein the modifying includes coupling the first RF electrical signal and the second RF electrical signal to one another to generate the first modified RF electrical signal and the second modified RF electrical signal.

C6. The method of any of paragraphs C1-C5, wherein the space transformer includes any suitable structure, function, and/or feature of any of the space transformers of any of paragraphs A1-A46 or of the probe system of paragraph B6.

INDUSTRIAL APPLICABILITY

The space transformers, probe systems, and methods disclosed herein are applicable to the integrated circuit device manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A space transformer configured to be utilized in a probe system to facilitate electrical communication with a device under test (DUT), the space transformer comprising:
    a dielectric body;
    a plurality of first electrical contacts supported by the dielectric body and arranged with at least one first pitch spacing;
    a plurality of second electrical contacts supported by the dielectric body and arranged with at least one second pitch spacing that is less than the at least one first pitch spacing;
    a plurality of electrically conductive signal-transfer traces supported by the dielectric body, wherein each electrically conductive signal-transfer trace of the plurality of electrically conductive signal-transfer traces extends between, and electrically interconnects, a corresponding first electrical contact of the plurality of first electrical contacts and a corresponding second electrical contact of the plurality of second electrical contacts;
    an electrically conductive radio frequency (RF) signal-modifying trace in electrical communication with an RF signal-modifying second electrical contact of the plurality of second electrical contacts and configured to convey an RF electrical signal in electrical communication with the DUT; and
    an RF electrical signal-modifying structure in electrical communication with the electrically conductive RF signal-modifying trace and configured to receive the RF electrical signal from an input region of the electrically conductive RF signal-modifying trace and to discharge a modified RF electrical signal to an output region of the electrically conductive RF signal-modifying trace, wherein the RF electrical signal-modifying structure includes a coupler configured to receive the RF electrical signal, in the form of a first RF electrical signal, from the DUT, to receive a second RF electrical signal from the DUT, and to couple the first RF electrical signal and the second RF electrical signal to one another to generate the modified RF electrical signal, in the form of a first modified RF electrical signal, and also to generate a second modified RF electrical signal.

2. The space transformer of claim 1, wherein the space transformer is configured such that the RF electrical signal-modifying structure receives the first RF electrical signal from the DUT via a corresponding RF signal-receiving second electrical contact of the plurality of second electrical contacts and receives the second RF electrical signal from the DUT via another corresponding RF signal-receiving second electrical contact of the plurality of second electrical contacts.

3. The space transformer of claim 1, wherein the space transformer is configured to return the first modified RF electrical signal and the second modified RF electrical signal to corresponding DUT contact pads of the DUT.

4. The space transformer of claim 1, wherein the space transformer is configured such that the RF electrical signal-modifying structure returns the first modified RF electrical signal to the DUT via a corresponding RF signal-discharging second electrical contact of the plurality of second electrical contacts and returns the second modified RF electrical signal to the DUT via another corresponding RF signal-discharging second electrical contact of the plurality of second electrical contacts.

5. The space transformer of claim 1, wherein the coupler is configured to couple the first RF electrical signal and the second RF electrical signal to one another via at least one of:
    (i) a capacitive interaction between the first RF electrical signal and the second RF electrical signal;
    (ii) an inductive interaction between the first RF electrical signal and the second RF electrical signal; and
    (iii) an electric field interaction between the first RF electrical signal and the second RF electrical signal.

6. The space transformer of claim 1, wherein the coupler includes a first transmission line, which is configured to convey the first RF electrical signal, and a second transmission line, which is configured to convey the second RF electrical signal, wherein the first transmission line and the second transmission line are positioned relatively proximate one another to facilitate coupling between the first RF electrical signal and the second RF electrical signal.

7. The space transformer of claim 1, wherein the coupler includes a directional coupler.

8. The space transformer of claim 1, wherein the coupler includes a branchline coupler.

9. The space transformer of claim 1, wherein the coupler includes a quadrature hybrid coupler.

10. The space transformer of claim 1, wherein the coupler includes a passive coupler.

11. The space transformer of claim 1, wherein the dielectric body is a rigid dielectric body.

12. The space transformer of claim 1, wherein the dielectric body is a dielectric membrane.

13. The space transformer of claim 1, wherein the plurality of first electrical contacts includes a plurality of first electrical contact pads.

14. The space transformer of claim 1, wherein the plurality of first electrical contacts includes a plurality of first electrical contact tips.

15. The space transformer of claim 1, wherein the plurality of second electrical contacts includes a plurality of second electrical contact pads.

16. The space transformer of claim 1, wherein the plurality of second electrical contacts includes a plurality of probe tips.

17. The space transformer of claim 1, wherein the plurality of second electrical contacts is configured to directly contact the DUT to facilitate electrical communication between the probe system and the DUT.

18. The space transformer of claim 1, wherein the space transformer includes a plurality of electrically conductive RF signal-modifying traces and a corresponding plurality of RF electrical signal-modifying structures.

19. A probe system configured to test a device under test (DUT), the probe system comprising:
    a chuck that defines a support surface configured to support a substrate that includes the DUT;
    a probe head assembly that includes the space transformer of claim 1; and
    a signal generation and analysis assembly configured to at least one of:
    (i) provide a test signal to the DUT via the space transformer; and
    (ii) receive a resultant signal from the DUT via the space transformer.

20. The probe system of claim 19, wherein the probe head assembly includes a plurality of probes configured to electrically contact corresponding DUT contact pads of the DUT, wherein the plurality of probes at least one of:
  (i) is defined by the plurality of second electrical contacts; and
  (ii) is configured to electrically connect a corresponding second electrical contact of the plurality of second electrical contacts with the corresponding DUT contact pad.

21. A method of testing a device under test (DUT) utilizing a probe system that includes a space transformer, the method comprising:
  providing an electric power signal to the DUT via the space transformer;
  responsive to the providing and with the space transformer, receiving a radio frequency (RF) electrical signal from the DUT; and
  modifying the RF electrical signal, within the space transformer and utilizing an RF electrical signal-modifying structure of the space transformer, to generate a modified RF electrical signal, wherein the method further includes returning the modified RF electrical signal to the DUT via the space transformer;
  wherein the RF electrical signal is a first RF electrical signal, wherein the modified RF electrical signal is a first modified RF electrical signal, wherein the receiving includes receiving a second RF electrical signal from the DUT, and further wherein the modifying includes modifying the second RF electrical signal, within the space transformer and utilizing the RF electrical signal-modifying structure, to generate a second modified RF electrical signal;
  wherein the modifying includes coupling the first RF electrical signal and the second RF electrical signal to one another to generate the first modified RF electrical signal and the second modified RF electrical signal.

22. The method of claim 21, wherein the returning includes returning the second modified RF electrical signal to the DUT via the space transformer.

* * * * *